United States Patent [19]
Reymond

[11] Patent Number: 5,818,884
[45] Date of Patent: Oct. 6, 1998

[54] HIGH SPEED SYNCHRONOUS DIGITAL DATA BUS SYSTEM HAVING UNTERMINATED DATA AND CLOCK BUSES

[75] Inventor: Welles Reymond, Waterbury, Conn.

[73] Assignee: General DataComm, Inc., Middlebury, Conn.

[21] Appl. No.: 411,343

[22] Filed: Mar. 27, 1995

Related U.S. Application Data

[63] Continuation-in-part of Ser. No. 143,442, Oct. 26, 1993, Pat. No. 5,517,532.

[51] Int. Cl.$^6$ ....................................................... H04L 7/00
[52] U.S. Cl. ............................ 375/354; 327/141; 370/489
[58] Field of Search .................................... 375/354, 355, 375/356; 327/141, 144, 145; 370/85.1, 100.1, 94.3, 503, 489

[56] References Cited

U.S. PATENT DOCUMENTS

| | | | |
|---|---|---|---|
| 5,255,375 | 10/1993 | Crook et al. | 395/325 |
| 5,301,186 | 4/1994 | Galuszka et al. | 370/24 |
| 5,355,391 | 10/1994 | Horowitz et al. | 370/85.1 |
| 5,384,769 | 1/1995 | Oprescu et al. | 370/85.1 |
| 5,517,532 | 5/1996 | Reymond | 375/354 |

Primary Examiner—Stephen Chin
Assistant Examiner—Bryan Webster
Attorney, Agent, or Firm—David P. Gordon

[57] ABSTRACT

A high speed synchronous digital bidirectional data bus system is provided and includes an M-bit unterminated data bus, an unterminated standing sine wave clock bus, and a plurality of integrated circuit bus interfaces. Each IC bus interface is preferably substantially incorporated on a single CMOS LSI chip and includes M bus drivers with associated send data logic, M data receivers with associated receive data logic, and a clock receiver. The output currents of the bus drivers on all of the chips are preferably stabilized so that each driver drives the bus at substantially the same output current. The drivers are preferably complementary polar driven CMOS logic elements. For this case, for each data receiver, a bus keeper is coupled to the output and the input of the bus receiver to maintain the last state of the data bus. In addition, the clock receivers and the data receivers are embodied as high speed comparators having internal hysteresis. The clock receivers are preferably provided with a delay generator which produces a "guard band" during which the bus drivers are tri-stated before they can drive the data bus. This prevents conflicts on the bus and guarantees end sampling of data.

39 Claims, 6 Drawing Sheets

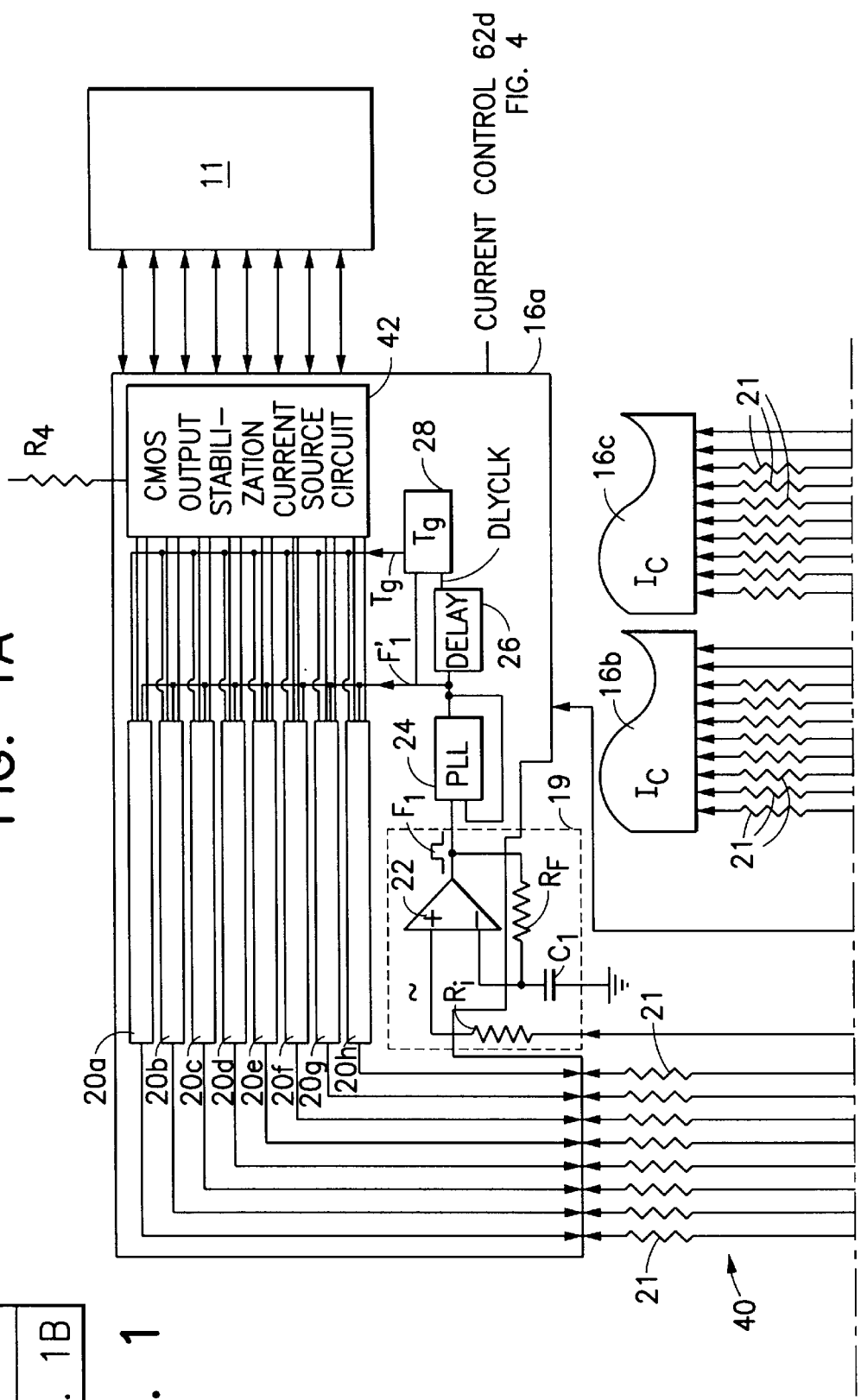

HIGH SPEED SYNCHRONOUS DIGITAL DATA BUS SYSTEM HAVING UNTERMINATED DATA AND CLOCK BUSES

This application is a continuation-in-part of U.S. Ser. No. 08/143,442 filed Oct. 26, 1993, now issued as U.S. Pat. No. 5,517,532. This application also relates to and is being filed of even date with U.S. Ser. Nos. 08/411,342, now issued as U.S. Pat. No. 5,510,729, and 08/411,341 which are hereby incorporated by reference in their entireties herein.

BACKGROUND OF THE INVENTION

1. Field of the Invention

The present invention relates to high speed synchronous digital data bus systems. More particularly, the present invention relates to high speed synchronous data bus systems utilizing unterminated data and clock buses. While not limited thereto, the invention has particular application with reference to data communication backplanes.

2. State of the Art

For purposes of clarity of the invention, various terms of art should be understood and defined. A "synchronous" data bus system is a system in which data source and sink entities access (i.e., send, receive, or exchange) data on one or more circuit paths (i.e., a data bus) according to predetermined rules and at times derived from a common clock. A "data bus", as opposed to a point to point connection, is a circuit path which may have more than two entities coupled thereto. For example, a circuit path having one source and two sinks would constitute a broadcast data bus, while three source/sink entities on a common bus thread would constitute a generalized bidirectional bus. The term "bidirectional" data bus implies that more than one entity is allowed to set the state (i.e., voltage) on a bus thread. It will be appreciated that in order to constitute a bidirectional synchronous data bus, the states set by the entities coupled to the bus should not be conflicting. For example, in a simplistic and ideal synchronous bidirectional data bus system, a first entity could control the bus thread during a first bit interval, while a second entity could control the bus thread during another bit interval which might be adjacent the first bit interval. In reality, due to various causes there will be some difference in the perception by the different entities of the common clock, and this difference is referred to as "clock skew". Clock skew can cause overlap (i.e., conflict) between time adjacent sources or reduce time margins for data sinks reading data from the data bus. Source overlap/conflict can cause significant problems and adversely affect system operation depending upon the architecture and implementation of the system unless special precautions are taken.

"Polar driven" CMOS logic elements, for purposes herein, are logic elements which have both n-type and p-type output devices (e.g., driving transistors) where the p-type device tries to connect its output to the high voltage rail thereby making the output HIGH, while the n-type device tries to force the output low. Devices that only have n-type devices for pulling low only are called "open collector" or "open drain" devices. Open collector devices typically utilize a pull-up resistor to the high rail in order to passively generate a high voltage on the data bus when the n-type device is turned OFF. Open collector device systems have the advantage of being able to connect logic outputs together without fear of conflict, and a logical OR function can be easily performed. On the other hand, open collector device systems have the disadvantage that they consume much more power than polar driven devices. In addition, open collector device systems usually compromise rise time performance, and therefore system speed.

A "terminated" bus is a bus which utilizes terminating resistors or Thevinin resistive networks at its ends in order to reduce reflections and provide a preferred state. A data bus whose electrical length is more than about one-third the potential signal rise time will typically experience significant reflections and should be treated as a transmission line. In order to minimize reflections, the bus must have a linear topology and provide terminating resistors or equivalents at its ends. Most buses of this type, and especially bidirectional buses, use the open collector approach where the pull-up function is provided by the terminating resistors. This approach, is used by the FUTURE BUS technology which utilizes bipolar transistors (as opposed to CMOS transistors). On the other hand, "unterminated" means that no resistances or resistive equivalents are provided on the ends of the bus in order to reduce reflections. Thus, in principle, an unterminated bus has an infinite impedance at DC (zero frequency) and no preferred state. In unterminated bus systems, it is desirable to provide hysteresis in the data receivers as the data change waveforms on such buses are non-monotonic and have indeterminate dv/dt.

As will be appreciated by those skilled in the art, most, if not all, high speed digital bidirectional data bus systems of the art are terminated systems which utilize square wave clock bus signals. The two major physical parameters which determine the performance of all bus systems are the electrical length (delay) $t_L$ of the system, and the total low frequency capacitance $C_T$ of a bus thread (which in conjunction with the electrical length $t_L$ can be used to find the impedance $Z_L$ for terminated systems).

As basically taught in the parent application hereto, the total low frequency capacitance $C_T$ is the sum of two components: the total capacitance $C_O$ of the intrinsic line and the sum $C_L$ of all the parasitic access node capacitances; i.e.

$$C_T = C_O + C_L \qquad (1)$$

For the highest performance, it is desirable to maintain a low $C_T$.

The electrical length of the system, $t_L$, is a function of the intrinsic length $t_o$ of the transmission line, and the ratio of $C_L$ to $C_O$. For a simple evenly distributed case, the relationship is defined by:

$$t_L = t_o \sqrt{1 + \frac{C_L}{C_O}} \qquad (2)$$

For the highest performance, and particularly in unterminated systems, it is desirable to maintain a low $t_L$. It will also be recognized from equations (1) and (2) that it is important to maintain a low $C_L$ as parasitic access node capacitance affects both $C_T$ and $t_L$.

A third parameter which is also important in determining system performance is system clock skew. The system clock skew includes clock skew due to the clock bus and circuitry, as well as the skew due to the circuitry in the data bus transceivers. In order to reduce clock bus skew, parent application Ser. No. 08/143,442 describes an unterminated high frequency clock bus having a clock phase and frequency distribution system which uses a standing sine wave and provides substantially simultaneous significant crossing instances everywhere in the system while using low power and not requiring precise control of transmission path characteristics ($Z_0$). With the standing sine wave clock bus, a substantially simultaneous clock transition occurs everywhere in the system, such that the major contributor to the clock bus skew is the variation in the delay of the clock receivers, and the internal logic of each device coupled to the bus. However, the issue of skew due to data propagation and the circuitry which processes the data is not dealt with by the parent invention; nor is it adequately dealt with in the prior art.

In unterminated bus systems such as disclosed in the parent application hereto, the data transceivers and clock receivers are preferably high impedance CMOS devices. CMOS drive devices have variable and nonlinear output characteristics which affect rise and fall times, output voltage, resistance and current. It should be noted that in an unterminated data bus, each bus driver acts largely as a current source/sink over a significant portion of a data transition rather than as a mere switch. Differences in the output characteristics among CMOS bus drivers result in differences in the amount of time it takes for each driver to change the level of the bus. These differences in the output characteristics of the bus drivers appear as differences in delay to a receiver on the bus. Prior art unterminated data buses solve this problem by slowing down the data transfer rate to accommodate the slowest bus driver while suffering the noise and cross talk of the fastest; thereby putting significant restraints on the system.

SUMMARY OF THE INVENTION

It is therefore an object of the invention to provide a high speed CMOS bidirectional digital data bus system.

It is another object of the invention to provide a high speed synchronous bidirectional data bus system having unterminated clock and data buses.

It is a further object of the invention to provide a high speed data bus system having drivers and receivers which may be integrated into CMOS application specific integrated circuits (ASICs).

It is an additional object of the invention to provide a high speed digital data bidirectional bus system where the impedances of the data bus are not critical to the functioning of the system.

Another object of the invention is to provide a high speed digital data bidirectional bus system which uses little power.

A further object of the invention is to provide a high speed digital data bus system which can be configured in most any topography.

An additional object of the invention is to provide both polar driven CMOS and open-drain CMOS high speed bus systems.

Yet another object of the invention is to provide a high speed digital data bus system having complementary bus drivers which maintain the data bus at its last state when no drivers are writing to the bus.

Yet a further object of the invention is to provide a high speed digital data bus system having a plurality of CMOS bus drivers on a plurality of LSI chips, where the CMOS bus drivers on the different LSI chips are stabilized such that the output characteristics are all similar.

In accord with these objects which will be discussed in detail below, a high speed synchronous digital bidirectional data bus system is provided and includes an M-bit unterminated data bus (M being an integer greater than 0), an unterminated standing sine wave clock bus, and a plurality of integrated circuit bus interfaces. Each IC bus interface is preferably substantially incorporated on a single CMOS LSI chip and includes M bus drivers with associated send data logic, M data receivers with associated receive data logic, and a clock receiver.

According to one aspect of the invention, the output currents of the bus drivers on all of the chips are stabilized so that each transceiver drives the bus at substantially the same output current. This is accomplished by selecting a representative device on each CMOS LSI chip and subjecting the representative device to a known and stable current provided by a current source, and by providing an output CMOS driving transistor which is coupled to the bus and which is arranged to mirror the representative device and thereby supply a known and stable proportional output current. The current mirror is preferably arranged by coupling the gates of the representative and driving transistors to the same voltage, and by coupling the sources of those transistors to ground. The driver may be arranged to be a complementary (i.e., polar driven CMOS logic element) by selecting an n-type and a p-type representative device which are respectively arranged in current mirror relationships with n-type and p-type drivers.

According other preferred aspects of the invention, for each data receiver, a bus keeper is coupled to the output and the input of the bus receiver to maintain the last state of the data bus in the bus receiver (and on the data bus) when no bus drivers are driving the bus. In addition, the clock receivers and the data receivers are embodied as high speed comparators having internal hysteresis. Further, the clock receivers are preferably provided with a delay generator which produces a "guard band" or "dead zone" during which the bus drivers are tri-stated before they can drive the data bus. The guard band ensures that system clock skew does not cause two cards to drive the data bus simultaneously and also ensures that P-channel and N-channel output drivers are not on simultaneously when transmitting consecutive 1 and 0 or consecutive 0 and 1.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1B:
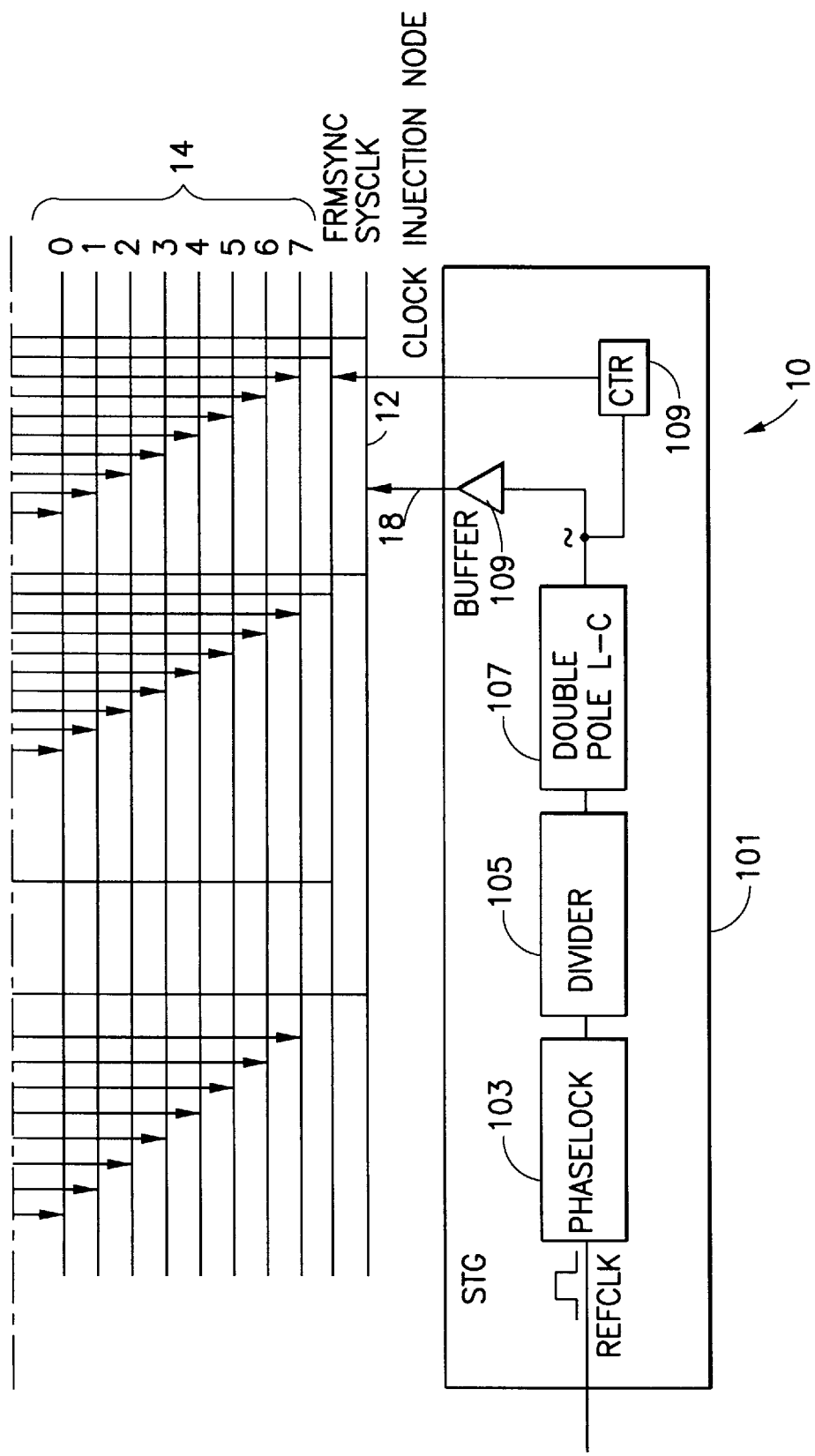
FIG. 1 is a partial circuit, partial block diagram of the high speed synchronous digital data bus system of the invention having a standing sine wave unterminated clock bus, an unterminated data bus and a plurality of bus transceivers.

While not limited thereto, the invention will be described with reference to a high speed synchronous bidirectional digital bus system for a telecommunications backplane. Referring to FIG. 1, the bus system 10 according to the invention is seen to include an unterminated sine wave clock bus 12 (SYSCLK), an eight bit unterminated data bus 14 having eight bidirectional data lines 0–7, and a plurality of integrated circuit bus interfaces 16a, 16b, 16c . . . with associated, preferably discrete components (e.g., $R_4$, $R_i$, $R_F$, $C_1$). The IC bus interfaces 16 are coupled to the data and the clock buses.

The unterminated sine wave clock bus 12 is generally as taught in detail in previous incorporated parent application Ser. No. 08/143,442. Thus, a system timing generator 101 (STG) is provided to generate the high speed sine wave clock signal (SYSCLK), e.g., a 4.096 MHz system sine wave clock, which is injected at node 18 onto the SYSCLK unterminated clock bus 12. The system sine wave clock is generated, e.g., from an 8 KHz square wave reference clock (REFCLK). In particular, in the preferred embodiment, the STG 101 receives an 8 KHz square wave REFCLK and translates this to an 8.192 MHz square wave utilizing a phase locked loop 103. The output of the PLL 103 is divided by two by a divider 105 to get a 4.096 MHz square wave with very good symmetry, in order to minimize even harmonic content. Of particular importance is the second harmonic which is the most significant contributor to harmonic distortion. As taught in the parent application hereto, the 4.096 MHz square wave is then passed through a double pole L-C type tuned filter 107 which extracts the fundamental harmonic at 4.096 MHz and attenuates all other harmonics. The 4.096 MHz sine wave is then passed through a unity gain buffer 109 to isolate it from the bus 12 which is an essentially a lossless unterminated transmission line. Since the line has no termination, a reflection coefficient of unity generates a 100% non-inverted reflected sine wave. The transmitted and reflected waves add to produce a standing wave whose phase angle is the same anywhere along the transmission line. The edges of the clock are smooth and continuous (monotonic) by virtue of the standing sine wave. As taught in the parent application hereto, the significant timing instants (zero crossings), occur at the same time everywhere on the bus, regardless of physical location. Thus, the system clock timing skew (which is only part of the total system skew) will consist of only the differential delay due to the clock receivers 19 of the integrated circuit interfaces 16.

In typical telecommunications applications, data is transferred in a frame of sixty-four eight bit time slots at a rate of 4.096 mbps. A frame synchronization signal is often used to identify the data frame boundaries. Thus, the STG 101 is provided with a counter 109, which is used to divide the 4.096 MHz sine wave signal, and provide a desired frame synch signal to a FRMSYNC bus.

For an eight bit data bus, each integrated circuit bus interface, e.g. 16a, includes a single clock receiver 19, and eight one-bit data transceivers 20a–20h. The data transceivers 20a–20h are each coupled to a respective data line, preferably via resistors 21, and to an external source/receiver of data 11. It should be appreciated, however, that circuitry (not shown) can be provided to permit a single transceiver to simultaneously or alternately drive one or more data lines of data bus 14. In addition, resistors 21, which preferably have a resistance of between 25Ω and 250Ω, need not be provided. The preferred embodiment of the invention, however, includes the resistors 21 because the resistors help provide a bus damping function at frequencies higher than the data rate. This bus damping function is desirable as the data bus 14 is nonterminated. Thus, reflections are allowed to exist for the data signals provided they are controlled and permit the data signal to get to the desired state (voltage level) in the allowed time. In addition, the resistors also help reduce the power dissipation of the drivers and add to the $R_{ON}$ characteristics of the driver devices so that the bus is quickly damped after the data signal has safely passed the voltage threshold of the comparator in the receiver.

Figure 2:
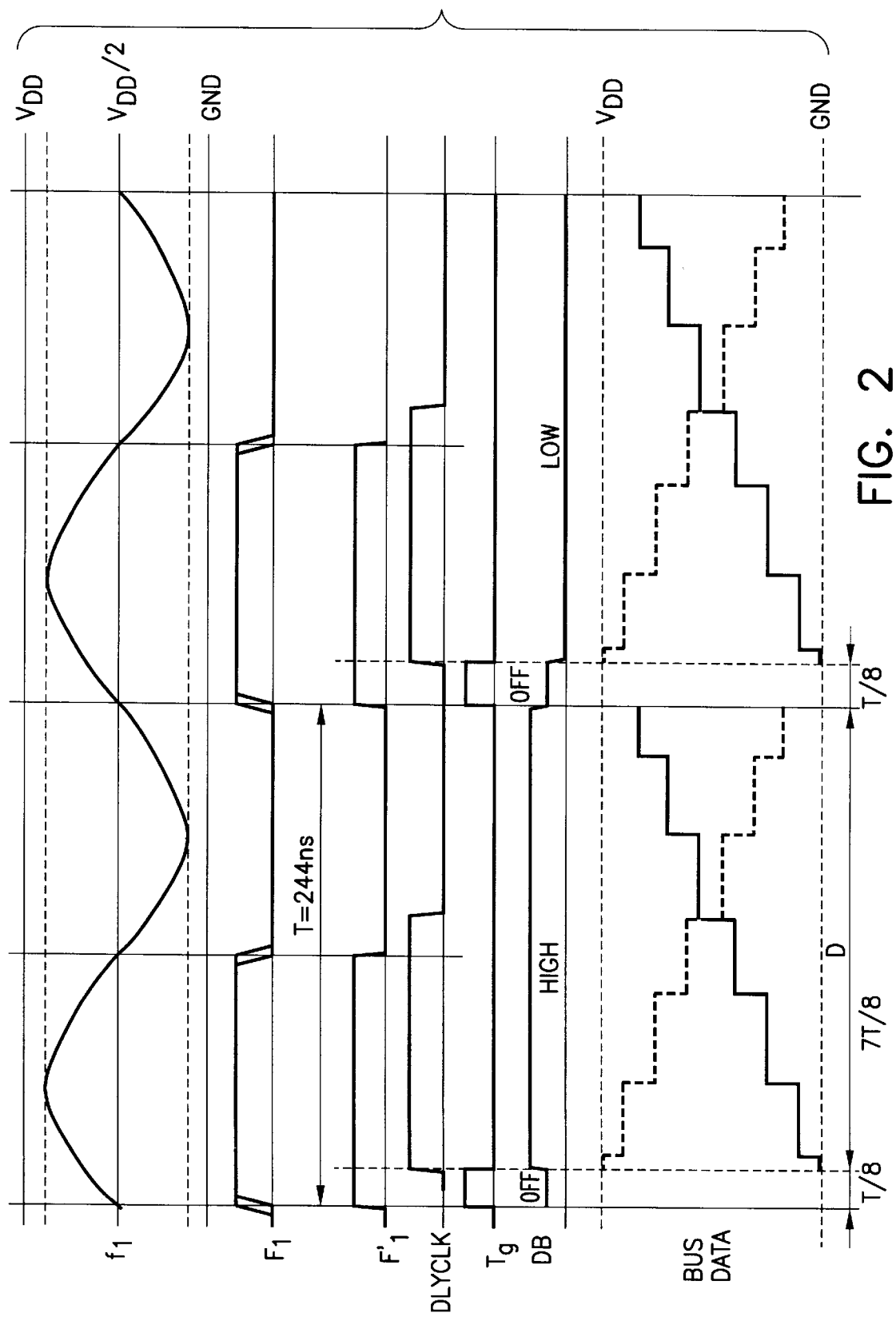
FIG. 2 is a timing diagram illustrating how data transfer is effected in the system of FIG. 1.

Each clock receiver 19 may take any of many formats as described in the parent application hereto. Thus, as shown in FIG. 1, the clock receiver 19 includes a comparator 22 having one of its inputs coupled to the clock bus 12 through a filtering resistor $R_i$. A feedback resistor $R_F$ is coupled to the output of the comparator 22 and to the other of its inputs which is also coupled to ground through a filtering capacitor $C_1$. Preferably, the comparator 22 is a MOS comparator with internal hysteresis such as described with reference to FIG. 5 hereof. Regardless of the exact form of the comparator 22 or the clock receiver, as shown in FIGS. 1 and 2, the comparator 22 converts the standing sine wave SYSCLK "$f_1$" to a square wave $F_1$ which is subject to some jitter at the zero crossing points of the sine wave. The square wave output of the comparator 22 may then be coupled to a phase locked loop 24 or other means to remove jitter from the square wave $F_1$ and produce an output clock signal $F_1'$ which is supplied to each of the data transceivers 20a–20h. The $F_1'$ clock signal is a phase locked version of the $F_1$ clock and preferably has a period T of approximately 244 nanoseconds. The clock signal $F_1'$ is also subjected to a delay circuit 26 which produces a delayed clock signal DLYCLK. The DLYCLK signal has the same period as the $F_1'$ clock but is delay shifted, for example, by a phase angle of T/8. The DLYCLK signal is combined with the $F_1'$ clock by the guard band circuit 28 to produce a guard band pulse Tg and for monitoring the lock-in condition of the PLL. The guard band pulse Tg is supplied to each of the data transceivers 20a–20h as will be discussed in more detail hereinafter.

Figure 3:
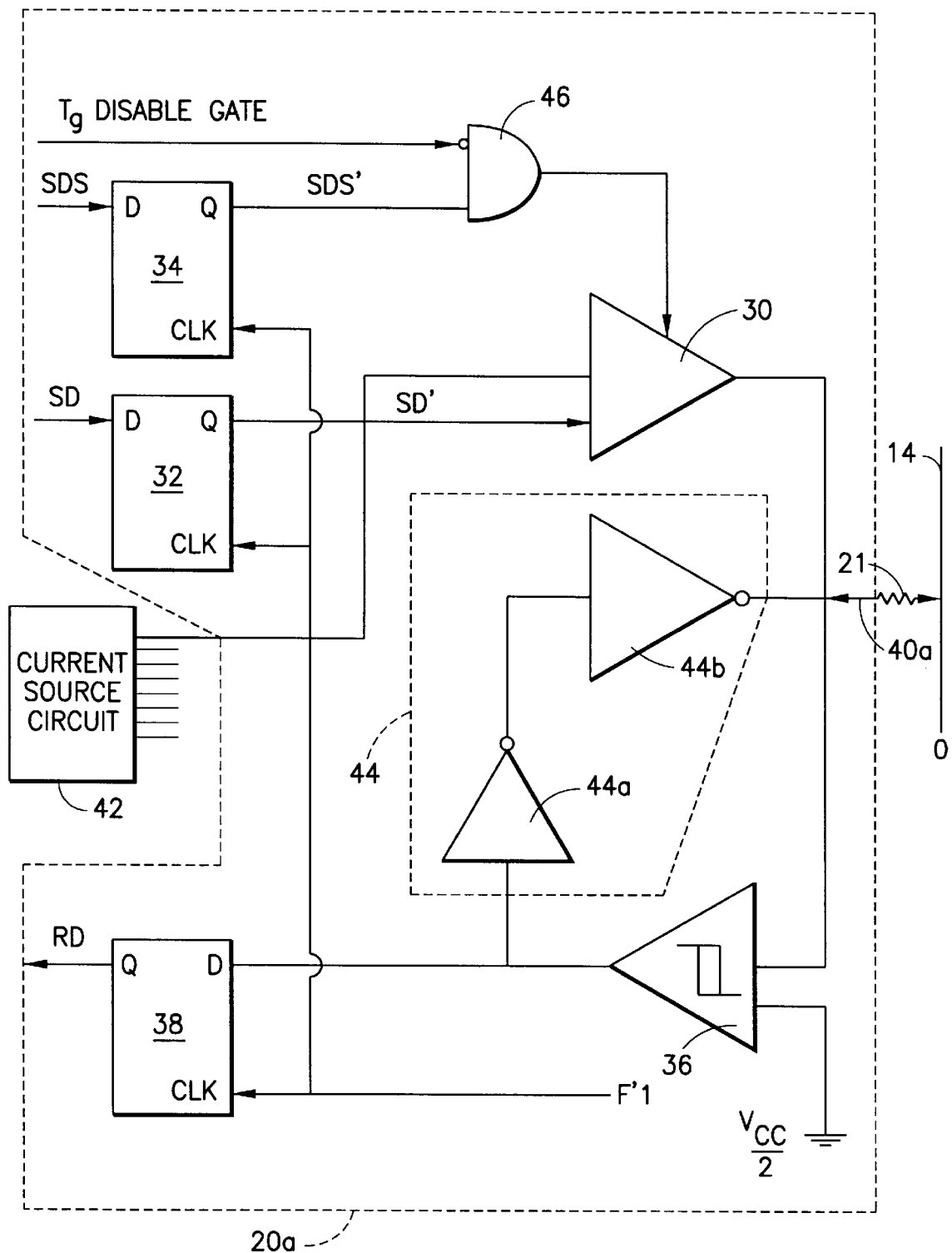
FIG. 3 is a simplified logic diagram of a one-bit data transceiver which uses CMOS output device stabilization according to the invention.

FIG. 3 shows a simplified logic diagram of one of the one bit data transceivers, e.g. 20a, of the integrated circuit bus interface 16. The transceiver 20a includes a bus driver 30 with associated send data logic 32, and a bus receiver 36 with associated receive data logic 38. A bidirectional coupling 40a preferably including the resistor 21 connects the output of the bus driver 30 and the input of the bus receiver 36 to a data line (0) of the data bus 14. In this simplified diagram of the preferred embodiment, the bus driver 30 is a tri-state CMOS line driver which is stabilized by use of the current source circuit 42, as discussed in more detail below with reference to FIG. 4, the bus receiver 36 is a high speed CMOS comparator (discussed in more detail below with reference to FIG. 5), and the send data and receive data logic 32, 38 are embodied by clocked DQ flip-flops. The bus driver 30 is enabled via a logic gate 46 by a send data select (SDS) signal which is clocked by a third DQ flip-flop 34. All of the associated send and receive logic is clocked by the clock signal $F_1'$ which is derived from the SYSCLK as described above.

According to a preferred aspect of the invention, in order to avoid bus contention which might result from clock skew, the clocked send data select signal (SDS') is combined through an AND gate 46 with the (inverted) guard band pulse Tg. The resulting signal which is shown in FIG. 3 as a control of the bus driver 30, prevents the bus driver 30 from being enabled during the guard band $T_g$; i.e., tristates the bus driver 30 during the guard band. In particular, and with reference to FIGS. 2 and 3, the guard band pulse Tg is used to disable the bus driver 30 at the beginning of each period T of the clock $F_1'$. During the guard band Tg, which in accord with the preferred embodiment of the invention has a duration of T/8, all of the bus drivers 30 of all integrated circuit interfaces 16 are tristated and the state of the bus is maintained by the bus keepers 44 (as described below) while the bus is read by the bus receivers 36. Following the guard band, a period D, which has a duration 7T/8, is allowed for data on the bus to change states in response to a bus driver 30 driving the bus high or low. The ON condition of the bus drivers 30 is indicated by the idealized wave form DB in FIG. 2. It is noted that the data is preferably read (sampled) substantially at the beginning of the clock period T.

It should be appreciated that the length of the guard band is chosen as a function of at least two factors. First, the guard band should be long enough to account for all clock skew in the system. At the same time, the guard band should not be so long as to deprive the bus drivers of enough time to drive the bus above or below the threshold high and low voltage values. While it is appreciated that bus drivers can be designed to force the bus voltage low or high quickly by using transistors which pull a large current, large currents are not desirable as they use larger amounts of power, and introduce issues of noise (crosstalk, etc.) into the system. Thus, the system should be designed carefully in order to reduce uncertainty as to how quickly the bus drivers can force voltages high or low, as well as uncertainty as to the amount of clock skew in the system. The concepts discussed below with reference to FIGS. 4 and 5 relate to these matters.

As previously mentioned, while the bus drivers 30 on all of the integrated circuit interfaces are tristated (e.g., during guard band $T_g$ and during longer periods of time when no device is transmitting), and in accord with a preferred aspect of the invention, the voltage level of the data bus may be clamped to its last level and held by a "bus keeper" circuit 44 until the guard band or non-transmission period is over. The bus keeper circuit 44 receives an input from the bus receiver 36 (described in more detail below with reference to FIG. 5) and provides a low level feedback signal to the input of the bus receiver 36 so that the level of the bus is maintained by all bus receivers 36 until it can be sampled by the receive data logic 38. In particular, the bus keeper 44 as shown in FIG. 3 includes two inverters 44a, 44b which cause the output of the bus keeper to equal the output of the comparator 36. The current provided by the bus keeper 44 is typically on the order of one-thousandth of the driver current (i.e., microamps as opposed to milliamps). The bus keeper circuit 44 is particularly advantageous when the drivers are all tristated, as the bus voltage could otherwise float.

In complementary driver systems (such as disclosed below with reference to FIG. 4) where bus keepers provide an important purpose, and particularly in data communications systems where the number of bus entities is highly variable (e.g., 3 to 32), the accuracy and tolerances of the keeper current can become a significant system design parameter as the bus entity trying to change the state of the bus must overcome all of the bus keepers' currents. For this reason, it is desirable to design the bus keeper with output stabilization features in a like manner to providing the bus drivers 30 with output stabilization and as discussed below with reference to FIG. 4.

According to a preferred aspect of the invention, the output of the all bus drivers 30 on a chip 16 are stabilized by a circuit 42 which is described in detail below with reference to FIG. 4. It should be appreciated, however, that a more complete understanding of the stabilization (matching) of data bus drivers, as well as alternate embodiments thereof can be obtained by reference to related U.S. Ser. No. 08/411,342 which has already been incorporated by reference herein in its entirety.

Figure 4:
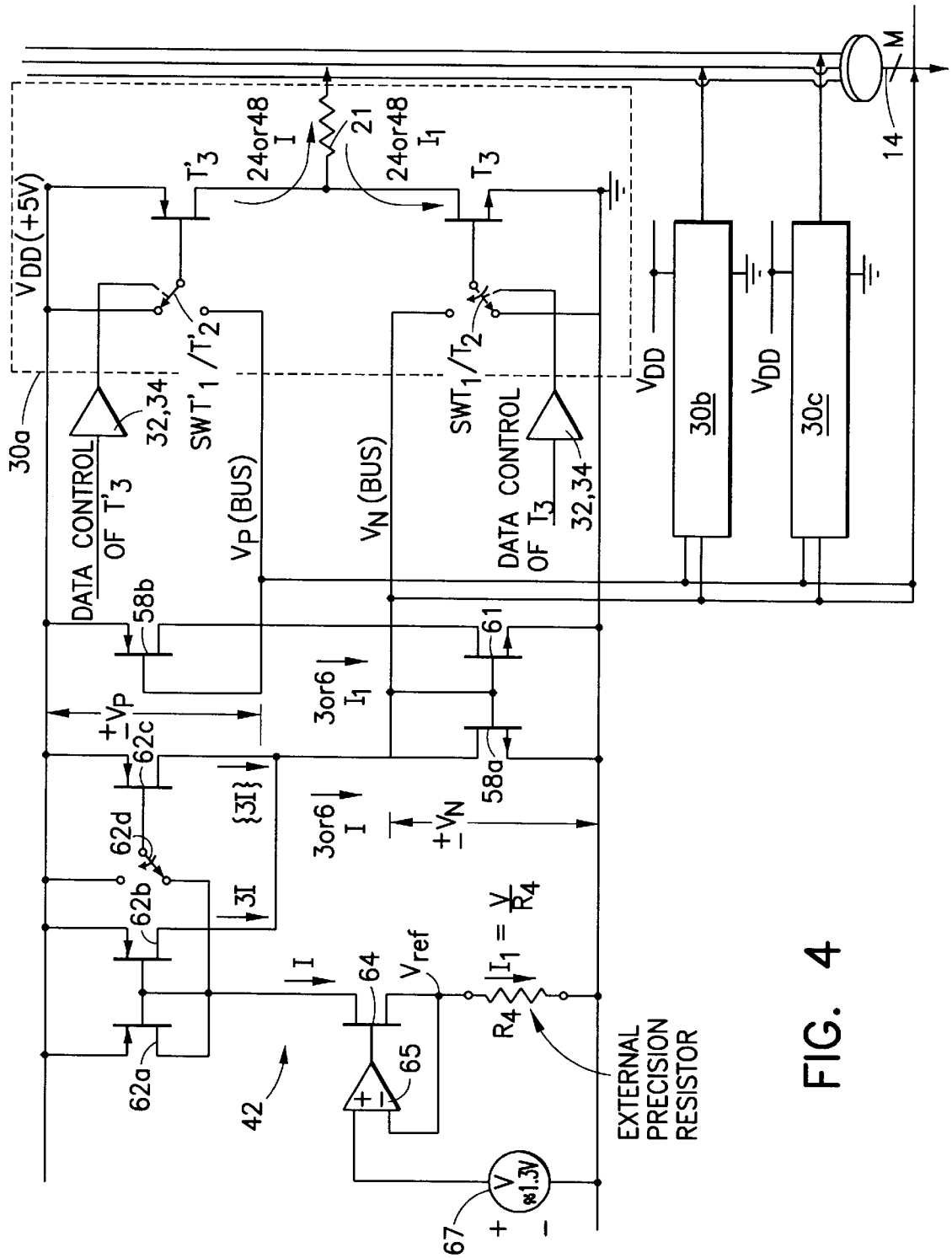
FIG. 4 is a simplified schematic diagram of the preferred CMOS bus driver circuit for use in the transceiver of FIG. 3.

Turning now to FIG. 4, a presently preferred embodiment of the saturated drain current stabilization technique is seen where a complementary driving circuit is provided with a mostly on-chip current source. In the embodiment of FIG. 4 it is seen the circuit includes a plurality of output devices 30'a, 30'b, 30'c . . . which are complementary devices with complementary driving transistors $T_3$ and $T'_3$. The complementary output transistors are controlled by control transistors which are shown as switches swT1/T2 and swT'1/T'2. The control transistors are in turn controlled by data control signals from logic 32 and 32'. As will be described in detail below, the amount of current flowing through the complementary driving transistors in their saturation region is related directly to the amount of current flowing through the representative transistors 58a and 58b, as the driving transistors are in current mirror relationship with the representative transistors. In turn, the amount of current flowing through the representative transistors 58a and 58b is controlled by a mostly on-chip current source.

The current source 42 of the embodiment of FIG. 4 includes a transistor 64, an operational amplifier 65, a band-gap reference voltage source 67, and a preferably off-chip (external) precision resistor R4. This well known follower circuit configuration regulates accurately a current I in the drain of transistor 64 equal to the voltage of the voltage source 67 divided by the resistance of resistor R4. In particular, operational amplifier 65 compares the voltage across resistor R4 with the constant reference voltage generated by the band gap reference voltage source 67. If the current I flowing through transistor 64 increases due to an increase in $V_{DD}$, or for any other reason, the voltage across resistor R4 will increase, thereby increasing the negative input voltage to comparator 65 and decreasing the output voltage which is applied to transistor 64. As the voltage to the gate of the transistor 64 is decreased, the current flow through the transistor is decreased; i.e., regulated. Likewise, if the current I should decrease due to a decrease in voltage $V_{DD}$, or for any other reason, the voltage across resistor R4 will decrease, which in turn will cause the comparator 65 to raise its output voltage which is applied to the gate of transistor 64. An increased voltage will tend to increase the current flow through transistor 64, thereby similarly stabilizing the current I. Put another way, the op amp 65 tries to keep the voltage at the negative input equal to the preset stable voltage supplied to its positive input. As a result, the voltage across R4 will always be stabilized by the op amp 65, and the resulting current will be stable. It should be noted that the current I is adjustable or programmable by selecting the value of the resistor R4. Thus, it is desirable to provide resistor R4 off-chip, so that the precision of resistor R4 can be kept high, and so that the desired current can be easily controlled.

The current generated in transistor 64 is provided via the drain of transistor 64 to the diode-connected transistor 62a which has its source coupled to the voltage rail $V_{DD}$, and its gate and drain coupled to the drain of transistor 64. Coupled in current-mirror relationship with transistor 62a are one or both of transistors 62b, and 62c. In particular, transistor 62b has its gate coupled to the gate of transistor 62a, its source coupled to the voltage rail $V_{DD}$, and its drain coupled to the drain of the first representative diode-connected transistor 58a. As shown, transistor 62b is chosen to be three times as wide as transistor 62a. Thus, if a current I flows through transistor 62a, a current of 3I will flow through transistor 62b to representative diode-connected device 58a. When switch 62d is in the position shown in FIG. 2b, transistor 62c is likewise coupled in current-mirror relationship with transistors 62a and 62b, with the gate of transistor 62c coupled to the gates of transistors 62a and 62b, and the source of transistor 62c coupled to the voltage rail $V_{DD}$. If transistor 62c is likewise arranged to be three times the width of transistor 62a, an additional current of 3I will flow through transistor 62c to representative device 58a when the switch 62d is properly positioned. However, when switch 62d is coupled to the voltage rail $V_{DD}$, it effectively open circuits transistor 62c, such that no current will flow through transistor 62c. It should be appreciated that switch 62d is provided to permit additional control over the current generated by the driving circuit of the invention. Thus, for example, if the lumped capacitance of the unterminated data bus driven by the output devices 50' of the circuit is large (e.g., due to numerous devices being coupled to the data bus), switch 62d might be arranged to increase the current being generated.

As will be appreciated by those skilled in the art, and as discussed above, the driving transistor $T_3$ is arranged in current mirror relationship with the representative transistor device 58a, with the gate of transistor 58a coupled to the gate of transistor $T_3$ (when enabled), and the sources of transistors 58a and $T_3$ coupled to the voltage rail $V_{SS}$ (ground). Thus, the amount of current flowing through transistor $T_3$ will depend upon the relative sizes of transistors $T_3$ and 58a. Where an 8:1 ratio is established, a saturation current of 24I or 48I (depending upon the position of switch 62d) will be generated by transistor $T_3$.

Because the embodiment of FIG. 4 is a complementary driving circuit, it is necessary to create a similar current in transistor $T'_3$. Thus, an additional transistor 61 and a second diode-connected representative transistor 58b are provided. Transistor 61 is arranged in current-mirror relationship with transistor 58b with its gate coupled to the gate of transistor 58b, and its source coupled to ground. The drain of transistor 61 is coupled to the drain of the diode-connected transistor 58b, and the source of transistor 58b is coupled to the high voltage rail $V_{DD}$. Thus, any current flowing through representative transistor 58a will be likewise be mirrored in transistor 61 and pulled through the second diode-connected representative transistor 58b. Since the second representative transistor 58b is arranged in current mirror relationship with the p-type driving transistor $T'_3$ (with the gates being coupled by swT'1/T'2), the amount of current flowing through transistor $T'_3$ will depend upon the relative sizes of transistors $T_3$ and 58a. Where an 8:1 ratio is established, a pull-up saturation current of 24I or 48I (depending upon the position of switch 62d) will be generated by transistor $T'_3$.

It should be appreciated that a single current source of FIG. 4 is used to drive several complementary output devices 30a, 30b, 30c . . . which are on a single chip 16a. Thus, each output device 30 includes bus driving transistors $T_3$ and $T'_3$ which are in current mirror relationship with transistors 58a and 58b respectively.

It will also be appreciated that where the chip is interfacing to a data bus 54, the number of bus driving transistors on the chip will generally correlate to the width "M" (i.e., number of bits) of the data bus. As all of the bus driving transistors of the single chip are arranged in current mirror relationship with the representative transistor 58 which draws the known and regulated current, all of the bus driving transistors on the single chip 16 will be well matched to each other. In addition, since the known and regulated current is reasonably reproducible on other chips, and since the current in the driving transistors of the different chips will be a function of the known and regulated current, the bus driving transistors on different chips (e.g., 16a, 16b, 16c . . . ) can be relatively well matched. While the use the complementary bus driver is not necessary in order to practice the invention (as other bus drivers are taught in the related application Ser. No. 08/411,342), those skilled in the art will appreciate that the ability to pull the data bus up and down reduces the amount of power required by the system, and adds to the efficiency and speed of the system. At the same time, with a complementary bus driver, bus "ORing" in the normal sense of an open collector pulled-up bus with a preferred state would appear to be excluded. However, in the system of the invention which includes bus keepers, either positive or negative ORing can be accomplished through use of a desired protocol. In particular, at certain bit intervals within a frame, by protocol, two bit times can be set aside for ORing. During the first bit time, one or more bus entities will pull the bus HIGH. This HIGH state is held by the bus keepers 44 until changed. Then, during the next bit time, all or pre-arranged bus access entities can effect the logic OR by applying a low voltage if their value is LOW, or tri-stating if their value would have been HIGH. Thus, if all bus entities have a HIGH value, the bus keeper will keep the bus at its preset HIGH value, while if one or more ORing entities have a LOW bit, they may apply the low voltage simultaneously without conflict; thereby accomplishing a bus OR function. It should be appreciated that bus ORing can also be accomplished with opposite polarities; i.e., pulling the bus LOW during the first bit time, and tri-stating or pulling the bus HIGH during the ORing bit time.

According to another aspect of the invention, hysteresis is provided in the bus receivers 36 (FIG. 3) as well as in the clock receiver 19 (FIG. 1) by providing the high speed comparator with internal hysteresis as discussed in detail below with reference to FIG. 5. It should be appreciated, however, that a more complete understanding of the high speed comparator with internal hysteresis, as well as alternative embodiments thereof can be obtained by reference to related U.S. Ser. No. 08/411,341 which has already been incorporated by reference herein in its entirety.

Figure 5:
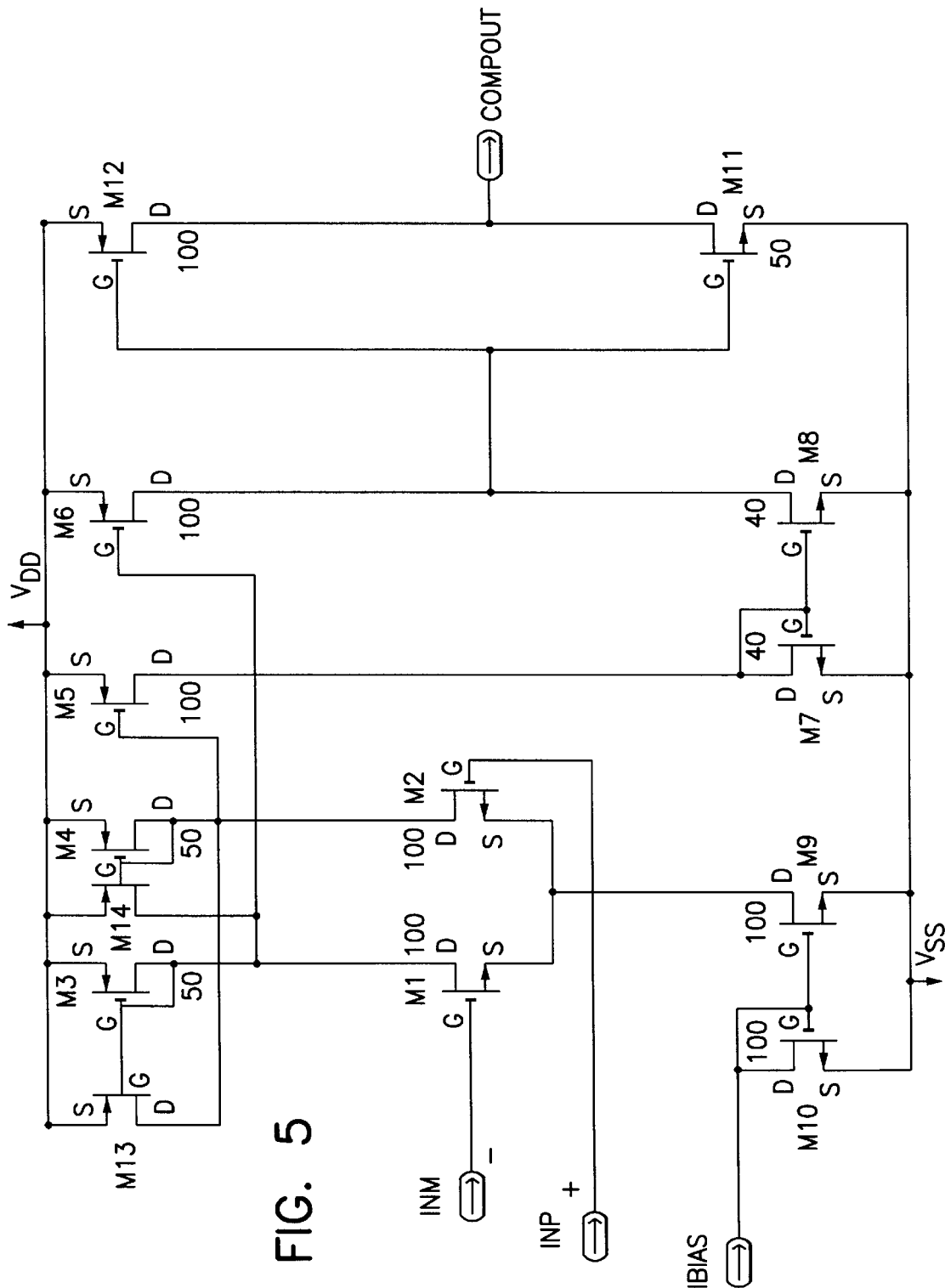
FIG. 5 is a circuit diagram of the preferred high speed comparator having internal hysteresis for use in the transceiver of FIG. 3.

Turning now to FIG. 5, a preferred embodiment of the comparator 36 (and 102) of the invention is seen in FIG. 5 and includes fourteen MOSFET transistors M1–M14. It will be appreciated by those skilled in the art that the comparator 36 is a modification of a conventional MOSFET device having the twelve transistors M1–M12 as shown in FIG. 1. However, as will be discussed in detail below, the addition of cross-coupled transistors M13 and M14 to the front end of the comparator 36 provides the comparator 36 with hysteresis.

Inputs into the comparator 36 may include, for example, a reference voltage INM, which in many applications will be a steady reference voltage, the input voltage INP (from bus 14 or 12) which is to be compared to the reference voltage INM, and a bias current IBIAS. The output of the comparator 36 is shown as COMPOUT1, although outputs may be taken from different points in the comparator. In addition, as discussed in detail in the related application Ser. No. 08/411, 341, an additional complementary output COMPOUT2 can be provided via the use of additional circuitry.

As seen in FIG. 5, transistors M1 and M2 are illustratively a differential pair of n-type MOS transistors having gates respectively receiving the reference voltage INM and the input voltage INP, and sources which are coupled to each other. In many systems, a reference voltage is supplied and taken as $V_{DD}/2$. The sources of transistors M1 and M2 are coupled to a current source comprised of transistors M9 and M10. In particular, the sources of transistors M1 and M2 are coupled to the drain of n-type MOS transistor M9 which has its source coupled to the voltage rail $V_{SS}$ and its gate coupled to the gate of n-type diode-connected MOS transistor M10.

Transistor M10 also has its source coupled to $V_{SS}$, while its drain receives the input bias current IBIAS. With their gates connected and their sources connected, transistors M9 and M10 form a current mirror current source. Thus, the steady current IBIAS which flows through transistor M10 is mirrored in transistor M9. Since the drain of transistor M9 is coupled to the sources of transistors M1 and M2, in a properly designed circuit, the IBIAS current will be pulled through transistors M1 and M2. As will be discussed in more detail hereinafter, most of the time, the IBIAS current will be pulled through one or the other of transistors M1 and M2. However, in a transition zone which occurs as the comparator switches state, currents are pulled through both transistors M1 and M2, the currents totalling IBIAS.

The drain of the differential transistor M1 is coupled to the gates of p-type MOS transistors M3 and M6, and to drain of p-type MOS transistor M14. As transistor M3 is diode-coupled, the drain of transistor M1 is also coupled to the drain of transistor M3. In a similar manner, the drain of transistor M2 is coupled to the gates of p-type MOS transistors M4 and M5, and to the drain of p-type MOS transistor M13. Again, as transistor M4 is diode-coupled, the drain of transistor M2 is also coupled to the drain of transistor M4. As seen, the gate of transistor M3 is coupled to the gate of transistor M13, while the gate of transistor M4 is coupled to the gate of transistor M14. The sources of transistors M3, M4, M5, M6, M13 and M14 are all coupled to the high voltage rail $V_{DD}$. With the provided arrangement of transistors, it will be appreciated that transistors M3, M6, and M13 effectively form a double current mirror, while transistors M4, M5, and M14 effectively form another double current mirror. It will also be appreciated that transistors M13 and M14 are effectively cross-coupled in that transistor M13 mirrors transistor M3 which has its drain coupled to the drain of differential transistor M1, while the drain of transistor M13 is coupled to the drain of differential transistor M2; and transistor M14 mirrors transistor M4 which has its drain coupled to the drain of differential transistor M2, while the drain of transistor M14 is coupled to the drain of differential transistor M1. The effect of the cross-coupling, as will be explained below is to provide a bistable current mirror flip-flop which provides internal hysteresis for the comparator. Since the circuit is symmetrical, the hysteresis produced is the same and independent of how the inputs are used. In addition, the bistable function which provides the hysteresis is optimized for high speed as it is located at the front end of the comparator and avoids delay from the output stage.

The output(s) of the comparator is effectively taken from the drains of differential transistors M1 and M2 (or M3 and M4), although transistors M6–M12 are preferably provided in order to generate the COMPOUT1 output. Thus, the gate of transistor M5 is coupled to the drain of transistor M1, while the drain of transistor M5 is coupled to the drain and gate of diode-connected n-type MOS transistor M7. Transistor M7 is coupled in current mirror relationship with the n-type MOS transistor M8, with the gates of transistors M7 and M8 being coupled, and the sources of transistors M7 and M8 being coupled to voltage rail $V_{SS}$. The drain of transistor M8 is coupled to the drain of transistor M6 which has its gate coupled to the drains of transistors M3 and M1. The drains of transistors M6 and M8 are coupled to the gates of n-type MOS transistor M11 and p-type MOS transistor M12, each of which is respectively source coupled to voltage rails $V_{SS}$ and $V_{DD}$. The drains of transistors M11 and M12 are coupled to each other and form the output COMPOUT1 of the comparator 36.

Operation of the comparator may be understood by reference to the related application Ser. No. 08/ - - - , - - - (Docket #GDC-050C). it should suffice to note that the cross-coupled transistors M13 and M14 will cause a delay in the change in output COMPOUT1 of the comparator until a respective threshold voltage (going high and going low) is reached at the gate of M2. In order to provide the desired amount of hysteresis $\Delta V_H$ (difference between going high and going low threshold voltages), the relative sizes of M13:M3 and M14:M4 are chosen carefully. In particular, in order to cause the going high voltage minus the reference voltage to be equal to the reference voltage minus the going low voltage, the W/L (width to length) ratio of transistors M13 and M14 are chosen to be K times larger than the W/L ratio of transistors M3 and M4;

$$\frac{M13}{M3} = \frac{M14}{M4} = K$$

The above described FIGS. 1 through 5 have addressed various aspects of the invention. As mentioned above, each bus interface according to the invention is preferably embodied substantially on a single CMOS LSI chip. The presently preferred embodiment is a sixty-eight pin PLCC. Those skilled in the art will appreciate that some of the components described above will be replicated on the chip for each bit of the data bus and other components will only be provided once on the chip. For example, the clock receiver and the associated clock circuits will be provided once on the chip and the outputs of that circuit will be made available to the other circuits on the chip.

There have been described and illustrated herein several embodiments of a high frequency bus system utilizing unterminated data and clock buses and integrated circuit bus interfaces incorporating CMOS output device stabilization and high speed comparators with internal hysteresis. While particular embodiments of the invention have been described, it is not intended that the invention be limited thereto, as it is intended that the invention be as broad in scope as the art will allow and that the specification be read likewise. Thus, while various aspects of the invention have been described with reference to the "backplane" system, it will be appreciated that aspects of the invention may be applied individually or in combination within the context of other systems or in other applications. Indeed, it will be recognized that the topology of the described system may include rings, stars, meshes, etc., and is not limited to a straight bus system. Thus, it will be appreciated that the CMOS output stabilization techniques taught herein has applications beyond the scope of backplanes. Also, while the invention has been described with reference to a sine wave clock bus, it will be appreciated that the invention could utilize a standard square wave high speed clock bus. In addition, while the generation of a guard band and the various bus timing techniques discussed herein may also be useful in bus systems other than the one shown. Moreover, the techniques described herein used to achieve internal, polarity independent hysteresis in high speed comparators may be applied to comparators other than data receivers in a bus system. It will therefore be appreciated by those skilled in the art that yet other modifications could be made to the provided invention without deviating from its spirit and scope as so claimed.

I claim:

1. A high speed data communications system, comprising:

a) an unterminated high speed clock bus having a substantially standing sine wave thereon;

b) an unterminated data bus of M threads, where M is an integer of at least two; and c) a plurality of integrated circuit bus interfaces, each bus interface including a clock receiver means coupled to said unterminated clock bus, a plurality of bus drivers with each of said plurality of bus drivers connected to a respective of said M threads of said data bus, and a plurality of data bus receivers with each data bus receiver connected to a respective of said M threads of said data bus.

2. A system according to claim 1, wherein:

each of said integrated circuit bus interfaces further comprises delay means coupled to said clock receiver for producing a delayed clock signal, said clock receiver converting said standing sine wave to a square wave clock having a period of T, said delayed clock signal also having a period of T and being delay phase shifted from said square wave clock by a phase angle of a fraction of T, and pulse means coupled to said clock receiver and said delay means for producing a pulse once during each period T, said pulse having a width substantially of said fraction of T, said pulse means being coupled to each of said plurality of bus drivers such that said plurality of bus drivers are prevented from driving said bus during said pulse.

3. A system according to claim 2, wherein:

data from all of said data receivers is sampled substantially at the beginning of said pulse.

4. A system according to claim 3, wherein:

said fraction of T is substantially one eighth of T.

5. A system according to claim 2, wherein:

each of said integrated circuit bus interfaces further comprises a plurality of send data logic means for sampling data to be placed on said data bus by said plurality of bus drivers, each of said plurality of send data logic means being coupled to a respective one of said plurality of bus drivers and being coupled to said clock receiver such that data to be placed on said data bus is sampled substantially at the beginning of said period T.

6. A system according to claim 1, wherein:

each of said plurality of bus drivers are part of an output stabilization means for stabilizing the output of each of said plurality of bus drivers so that the output characteristics of bus drivers in one integrated circuit bus interface closely match the output characteristics of bus drivers in another integrated circuit bus interface.

7. A system according to claim 6, wherein:

each of said bus drivers comprises a first MOS transistor, and said output stabilization means further includes a second MOS transistor coupled to said first MOS transistors of said bus drivers, said first MOS transistors and second MOS transistor being arranged to form a plurality of current mirror means when said first MOS transistors of said bus drivers are ON.

8. A system according to claim 1, wherein:

each of said clock receivers and each of said data receivers is a high speed comparator, and each of said high speed comparators is provided with internal means for generating hysteresis without the use of resistors.

9. A system according to claim 8, wherein:

said internal means for generating hysteresis includes current steering means at the front end of each of said high speed comparators for delaying the switching of said comparators from high to low and low to high.

10. A high speed data communications system, comprising:

a) a high speed clock bus;

b) an unterminated data bus of M threads, where M is an integer of at least two; and c) a plurality of integrated circuit bus interfaces, each bus interface including a clock receiver means coupled to said unterminated clock bus, a plurality of CMOS data bus drivers with each of said plurality of CMOS data bus drivers connected to a respective of said M threads of said data bus, said CMOS data bus drivers driving threads of said unterminated data bus both actively high and actively low, and a plurality of data bus receivers with each data bus receiver connected to a respective of said M threads of said data bus.

11. A system according to claim 10, wherein:

each of said data bus receivers including a bus keeper means for maintaining the level of the data bus in its last state when the data bus is not being driven by a CMOS data bus driver, each of said bus keeper means being coupled between an output and an input of a respective data bus receiver.

12. A system according to claim 10, wherein:

each of said integrated circuit bus interfaces further comprises delay means coupled to said clock receiver for producing a delayed clock signal, said clock receiver converting said standing sine wave to a square wave clock having a period of T, said delayed clock signal also having a period of T and being delay phase shifted from said square wave clock by a phase angle of a fraction of T, and pulse means coupled to said clock receiver and said delay means for producing a pulse once during each period T, said pulse having a width substantially of said fraction of T, said pulse means being coupled to each of said plurality of bus drivers such that said plurality of bus drivers are prevented from driving said bus during said pulse.

13. A system according to claim 12, wherein:

data from all of said data receivers is sampled substantially at the beginning of said pulse.

14. A system according to claim 13, wherein:

said fraction of T is substantially one eighth of T.

15. A system according to claim 12, wherein:

each of said integrated circuit bus interfaces further comprises a plurality of send data logic means for sampling data to be placed on said data bus by said plurality of bus drivers, each of said plurality of send data logic means being coupled to a respective one of said plurality of bus drivers and being coupled to said clock receiver such that data to be placed on said data bus is sampled substantially at the beginning of said period T.

16. A system according to claim 10, wherein:

each of said plurality of bus drivers are part of an output stabilization means for stabilizing the output of each of said plurality of bus drivers so that the output characteristics of bus drivers in one integrated circuit bus interface closely match the output characteristics of bus drivers in another integrated circuit bus interface.

17. A system according to claim 16, wherein:

each of said bus drivers comprises a first MOS transistor, and said output stabilization means further includes a second MOS transistor coupled to said first MOS transistors of said bus drivers, said first MOS transistors and second MOS transistor being arranged to form a plurality of current mirror means when said first MOS transistors of said bus drivers are ON.

18. A system according to claim 10, wherein:

each of said clock receivers and each of said data receivers is a high speed comparator, and each of said high speed comparators is provided with internal means for generating hysteresis without the use of resistors.

19. A system according to claim 18, wherein:

said internal means for generating hysteresis includes current steering means at the front end of each of said high speed comparators for delaying the switching of said comparators from high to low and low to high.

20. A system according to claim 11, wherein:

each bus keeper means incorporates an output characteristic stabilization means for stabilizing an output characteristic of each of said bus keeper means so that the output characteristics of bus keepers in one integrated circuit bus interface closely match the output characteristics of bus keepers in another integrated circuit bus interface.

21. A system according to claim 10, further comprising:

timing control means for causing at least one bus driver coupled to a particular thread of said data bus to impose a predetermined desired state on said particular thread in a first bit interval n−1, and for permitting a plurality of bus drivers coupled to said particular thread to impose an opposite state or to assume a tri-state state on said particular thread during a next bit interval n to effect an OR function.

22. A system according to claim 1, further comprising:

a plurality of resistors coupled between said bus drivers and said threads of said data bus.

23. A system according to claim 10, further comprising:

a plurality of resistors coupled between said bus drivers and said threads of said data bus.

24. A system according to claim 1, wherein:

each said integrated circuit bus interface is a CMOS device.

25. A system according to claim 11, wherein:

each said integrated circuit bus interface is a CMOS device.

26. A high speed integrated circuit bus interface for use with an unterminated data bus having M threads where M is an integer and a standing sine wave clock bus, said integrated circuit bus interface comprising:

a) a plurality of bus drivers coupled to threads of the data bus;

b) a plurality of bus receivers coupled to threads of the data bus; and c) a high speed clock receiver and means for coupling said clock receiver to the standing sine wave clock bus, wherein said clock receiver converts the standing sine wave to a square wave having a period T and provides said square wave, or a processed version thereof, to said plurality of bus drivers and said plurality of bus receivers.

27. An integrated circuit bus interface according to claim 26, further comprising:

d) output stabilization means coupled to each of said bus drivers for stabilizing the output of each of said bus drivers so that the outputs of bus drivers closely match each other.

28. An integrated circuit bus interface according to claim 26, wherein:

each of said bus receivers has a comparator means for generating hysteresis without the use of resistors.

29. A high speed integrated circuit bus interface for use with an unterminated data bus having M threads there M is an integer and a clock bus, said integrated circuit bus interface comprising:

a) a plurality of bus drivers coupled to threads of the data bus, each of said bus drivers including CMOS circuitry for driving threads of said unterminated data bus both actively high and actively low;

b) a plurality of data bus receivers coupled to threads of the data bus; and c) a high speed clock receiver coupled to the clock bus, said high speed clock receiver providing a clock signal to said plurality of bus drivers and plurality of data bus receivers.

30. A bus interface according to claim 29, wherein:

each of said data bus receivers including a bus keeper means for maintaining the level of a thread of the data bus in its last state when the thread of the data bus is not being driven by a CMOS data bus driver, each of said bus keeper means being coupled between an output and an input of a respective data bus receiver.

31. A bus interface according to claim 29, further comprising:

delay means coupled to said clock receiver for producing a delayed clock signal, said delayed clock signal also having a period of T and being delay phase shifted from the clock of said clock bus by a phase angle of a fraction of T, and pulse means coupled to said clock receiver and said delay means for producing a pulse once during each period T, said pulse having a width substantially of said fraction of T, said pulse means being coupled to each of said plurality of bus drivers such that said plurality of bus drivers are prevented from driving said bus during said pulse.

32. A bus interface according to claim 31, wherein:

data from all of said data receivers is sampled substantially at the beginning of said pulse.

33. A bus interface according to claim 32, wherein:

said fraction of T is substantially one eighth of T.

34. A bus interface according to claim 31, further comprising:

a plurality of send data logic means for sampling data to be placed on said data bus by said plurality of bus drivers, each of said plurality of send data logic means being coupled to a respective one of said plurality of bus drivers and being coupled to said clock receiver such that data to be placed on said data bus is sampled substantially at the beginning of said period T.

35. A bus interface according to claim 29, wherein:

each of said plurality of bus drivers are part of an output stabilization means for stabilizing the output of each of said plurality of bus drivers so that the output characteristics of bus drivers in said bus interface are closely matched and controlled.

36. A bus interface according to claim 35, wherein:

each of said bus drivers comprises a first MOS transistor, and said output stabilization means further includes a second MOS transistor coupled to said first MOS transistors of said bus drivers, said first MOS transistors and second MOS transistor being arranged to form a plurality of current mirror means when said first MOS transistors of said bus drivers are ON.

37. A bus interface according to claim 29, wherein:

each of said clock receivers and each of said data receivers is a high speed comparator, and each of said high speed comparators is provided with internal means for generating hysteresis without the use of resistors.

38. A system according to claim 37, wherein:

said internal means for generating hysteresis includes current steering means at the front end of each of said high speed comparators for delaying the switching of said comparators from high to low and low to high.

39. In a high speed communications system utilizing an unterminated data bus and a clock bus, a method of synchronizing data transfer among a plurality of data transceivers, each transceiver having a clock receiver which is coupled to the clock bus and a plurality of bus drivers and bus receivers which are coupled to the data bus, the bus drivers being complementary so as to actively drive the data bus high and low, said method comprising:

a) at each clock receiver, subjecting a received clock bus signal to a delay having a phase angle which is a fraction of a clock bus period T to produce a delayed clock signal;

b) at each clock receiver, combining said clock bus signal wave with said delayed clock signal to produce a pulse having a width substantially equal to said fraction of said clock bus period T;

c) forwarding said pulse to each bus driver in order to tri-state all bus drivers during said pulse.

* * * * *